United States Patent [19]
Manning

[11] Patent Number: 5,756,394
[45] Date of Patent: May 26, 1998

[54] SELF-ALIGNED SILICIDE STRAP CONNECTION OF POLYSILICON LAYERS

[75] Inventor: H. Monte Manning, Kuna, Id.

[73] Assignee: Micron Technology, Inc., Boise, Id.

[21] Appl. No.: 518,616

[22] Filed: Aug. 23, 1995

[51] Int. Cl.$^6$ .................................................. H01L 21/283
[52] U.S. Cl. .................... 438/618; 438/637; 438/647; 438/649; 438/755
[58] Field of Search .................. 437/200, 41 SM; 148/DIG. 19; 438/618, 621, 622, 637, 647, 649, 655, 657, 683, 755

[56] References Cited

U.S. PATENT DOCUMENTS

| | | | |
|---|---|---|---|
| 4,994,402 | 2/1991 | Chiu | 437/41 |
| 5,032,233 | 7/1991 | Yu et al. | |
| 5,043,300 | 8/1991 | Nulman | 437/200 |
| 5,084,406 | 1/1992 | Rhodes et al. | |
| 5,094,977 | 3/1992 | Yu et al. | |
| 5,147,819 | 9/1992 | Yu et al. | |
| 5,187,122 | 2/1993 | Bonis | 437/200 |
| 5,196,360 | 3/1993 | Doan et al. | 437/41 |
| 5,231,056 | 7/1993 | Sandhu | |
| 5,236,865 | 8/1993 | Sandhu et al. | |
| 5,341,016 | 8/1994 | Prall et al. | |
| 5,378,641 | 1/1995 | Cheffings | |

OTHER PUBLICATIONS

Y. Lou, C. Wu and H. Cheng, The Process Window of a-Si/Ti Bilayer Metallization for an Oxidation-Resistant and Self-Aligned TiSi2 Process, IEEE, vol. 39, No. 8, pp. 1835–1843, Aug. 1992.

*Primary Examiner*—T. N. Quach
*Attorney, Agent, or Firm*—Knobbe, Martens, Olson & Bear, LLP

[57] ABSTRACT

A method is disclosed for providing a self-aligned silicide strap for connecting thin polysilicon layers (poly-1 and poly-2, etc.) separated by non-conducting gaps. A butting contact opening to the layers is formed in an overlying insulating layer. The contact exposes the poly-1 and poly-2 layers. A thin polysilicon layer (poly-3) is then deposited over the insulating layer and into the contact. This is followed by deposition of a refractory metal layer. The poly-3 layer should be thin enough that, alone, it cannot supply enough silicon to support full silicidation of the refractory metal layer. The structure is next sintered so that a silicide strap is formed in the contact opening and across exposed portions of the poly-1 and poly-2 layers. The ratio of silicon to titanium in regions over the insulating layer is lower than that in the strap, such that these more metallic regions may be selectively removed. The preferred embodiment simultaneously provides cladding of device active areas, the silicon added by poly-3 serving to reduce spiking into the active areas.

23 Claims, 3 Drawing Sheets

SELF-ALIGNED SILICIDE STRAP CONNECTION OF POLYSILICON LAYERS

This invention relates to silicide straps across polysilicon layers in integrated circuits, and more particularly to straps formed by self-aligned silicidation.

BACKGROUND OF THE INVENTION

Integrated circuits often make use of multiple interconnecting layers. Such arrangements reduce chip area for a given number of devices or circuit elements. In order to provide electrical contact between two layers, for example, contact vias may be etched through an interlayer dielectric during fabrication. Alternatively, straps may be formed connecting one layer to another layer. One form of these straps makes use of a "butting contact" 10 such as that illustrated in FIG. 1. Straps are also used for interconnection of other elements or layers, wherever oxide or other non-conducting gaps need to be bridged.

The vias or straps must be fabricated of conductive material in order to provide electrical communication between the layers. Although other conducting materials may be used, it is advantageous to employ a silicide such as titanium silicide ($TiSi_2$) due to the low resistance or ohmic contact it forms with silicon, including both single crystal silicon and polycrystalline silicon. The latter material is often referred to as polysilicon, or poly.

Silicides have also been used for local interconnection, to provide low resistance electrical contact between device active regions within a silicon substrate (e.g., the drain of a MOSFET transistor) and other devices or conducting layers. Aluminum and other metals have lower sheet resistance than silicide. However, integration of these metals as a strap or local interconnect is difficult because of their high temperature instability and poor step coverage into contacts during deposition. The surface upon which the metal is to be deposited must be relatively smooth and therefore requires some type of planarization prior to metal deposition, which complicates the process. Additionally, many of the typical low-resistance metals also can contaminate the substrate in which the active devices are formed, causing parasitic leakage currents or device failure. For this reason, a diffusion barrier must also be formed to prevent diffusion of the metal ions to the silicon substrate. This also adds a level of complexity not required for alternative local interconnect materials. Thus, especially for narrow contacts formed in VLSI and ULSI circuits, silicide is increasingly used as a low resistance contact between device active areas and aluminum lines, or simply as the sole layer in a local interconnect.

For many interconnect applications, it is possible to employ a self-aligned silicidation process ("salicidation"). Salicidation is produced by depositing an elemental refractory metal layer, such as titanium, over silicon in any form, such as silicon substrates, amorphous silicon or polysilicon layers. Reaction between the titanium and the silicon takes place during a high temperature anneal or sinter step. The process is referred to as "self-aligned" because silicide forms only where the metal layer contacts silicon, for example, through contact openings. Ordinarily, salicidation is advantageous because silicide is formed exactly where it is desired, that is, over the polysilicon and substrate regions defined by a prior contact mask.

Salicidation, however, is sometimes difficult to perform. FIG. 1, for example, illustrates a butting contact opening 10 in an insulating layer 12, which covers a substrate 14, a first polysilicon layer 16, and a second polysilicon layer 18. The butting contact is well known and can be formed by a conventional photolithographic process and subsequent etch. Salicidation cannot ordinarily be employed to form a silicide strap across the polysilicon layers 16 and 18. It is often difficult to bridge an interlayer oxide layer 20 and a sidewall spacer 22. The spacer 22 forms as a byproduct of the contact etch.

FIG. 2 shows a strap 30 which would result if conventional salicidation techniques were applied to the butting contact 10 across two relatively thick polysilicon layers 16 and 18. After etching the contact opening 10 (FIG. 1) and depositing a layer of elemental titanium, a first sinter step results in the silicide strap 30 forming across the contact opening 10 (FIG. 2). A layer of unreacted titanium metal 32 and a layer of titanium nitride (TiN) byproduct 34 would next be selectively removed by processes known to this art. A final sinter may be performed to lower the silicide's sheet resistance to acceptable levels by converting the titanium from the C49 phase to the lower resistance C54 phase.

In the first place, either the thickness of deposited titanium needs to be carefully controlled, or the sinter time needs to be strictly controlled to avoid over-consumption consumption of the underlying silicon. Overconsumption would result in poor contact between the polysilicon layers and the strap. Even if overconsumption is avoided, the resulting strap 30 would be fragile. Though illustrated as spanning the gap formed by the interlayer oxide 20 and the oxide spacer 22, the strap 30 becomes very thin at a bridge 36 over the oxide spacer 22. This narrow bridge 36 would naturally demonstrate very high resistivity or would in practice be subject to mechanical failure (breakage).

The bridge 36 is too thin due to a lack of silicon to feed the salicidation process. Since salicidation consumes the underlying silicon in order to form $TiSi_2$, spanning thin polysilicon layers with this method would pose even more difficulty. An intrinsic resistor or a thin film transistor, for example, might be formed from a very thin silicon layer 54 (see FIG. 3). The thin polysilicon layer 54 cannot supply the correct proportion of silicon to titanium for salicidation over the thin layer 54. The strap produced by a standard salicidation process would be metal-rich and thus indistinguishable from other metal byproducts for purposes of the selective etch following the first sinter.

Because of these problems, manufacturers desiring straps across thin or thick polysilicon layers have necessarily resorted to alternatives other than salicidation. Traditionally, conductive straps have been fabricated through deposition techniques. Polysilicon or metal, for example, can be deposited into a contact opening directly onto the polysilicon layers and the substrate by co-sputtering, co-evaporation or chemical vapor deposition (CVD) techniques. Depositing silicide is costly, however, due to the requirement of an extra mask. A mask is necessary either for depositing the silicide at appropriate points on the circuit, or for etching away unwanted silicide. In either case, space is wasted in providing leeway for misalignment of the mask.

Salicide cladding over the substrate to form local interconnect can also be problematic. FIG. 2 illustrates simultaneous formation of a cladding 44 along with the salicided strap 30, discussed above. Salicidation over a thin active region 46, in order to provide ohmic contact to both the underlying active area 46 and to metal lines or to other circuit nodes (not shown), also consumes silicon of the substrate 14. During anneal, silicon from the substrate 14 dissolves into the overlying metal layer. Dissolution is not uniform, though, and as a result metallic spikes 48 are formed in the thin active region 46, interfering with the device's p-n junction. To remedy this situation, a polysilicon or amorphous silicon layer may be provided between the device active region and the refractory metal layer. However, an additional mask step is required to ensure correct alignment of the deposited silicon layer, increasing fabrication expense.

It is thus an object of the present invention to provide a self-aligned silicide strap for connection of thin polysilicon layers in an integrated circuit.

It is a further object of the present invention to provide such a strap without requiring post-salicidation masks for patterning the silicide.

It is a still further object of the present invention to reduce junction spiking during metallization of device active regions.

SUMMARY OF THE INVENTION

The present invention provides a method of forming self-aligned silicide straps across silicon layers. The method comprises opening a contact window in a top insulating layer, which step exposes the silicon layers to be strapped. A thin silicon layer and a metal layer are deposited over the structure. The structure is then sintered to form a silicon-rich silicide over the exposed silicon layers.

The contact window forming step may also simultaneously expose one or more circuit nodes, such as device active areas, to be clad for local interconnection. In this case, the silicon-rich silicide also forms over these circuit nodes.

BRIEF DESCRIPTION OF THE DRAWINGS

FIG. 3 illustrates an integrated circuit following deposition of an insulating layer and formation of contact windows or openings in the insulating layer.

FIG. 4 illustrates the integrated circuit of FIG. 3 following deposition of a thin polysilicon layer and an elemental refractory metal layer.

FIG. 5 illustrates the integrated circuit of FIG. 4 following a silicidation step.

FIG. 6 illustrates the integrated circuit of FIG. 5 following a cleaning step.

DETAILED DESCRIPTION OF THE PREFERRED EMBODIMENTS

The present invention provides a method of forming self-aligned silicide straps spanning polysilicon layers which are too thin to supply adequate amounts of silicon for the salicidation process. Such thin polysilicon layers are often found in VLSI circuits, in the form of thin film transistors (TFTs) and resistors. In order to support salicidation, additional polysilicon is provided to the structure. The additional polysilicon allows the use of thicker titanium layers without fear of overconsuming the underlying silicon, while at the same time retaining self-alignment of the salicide process.

Figure 1:
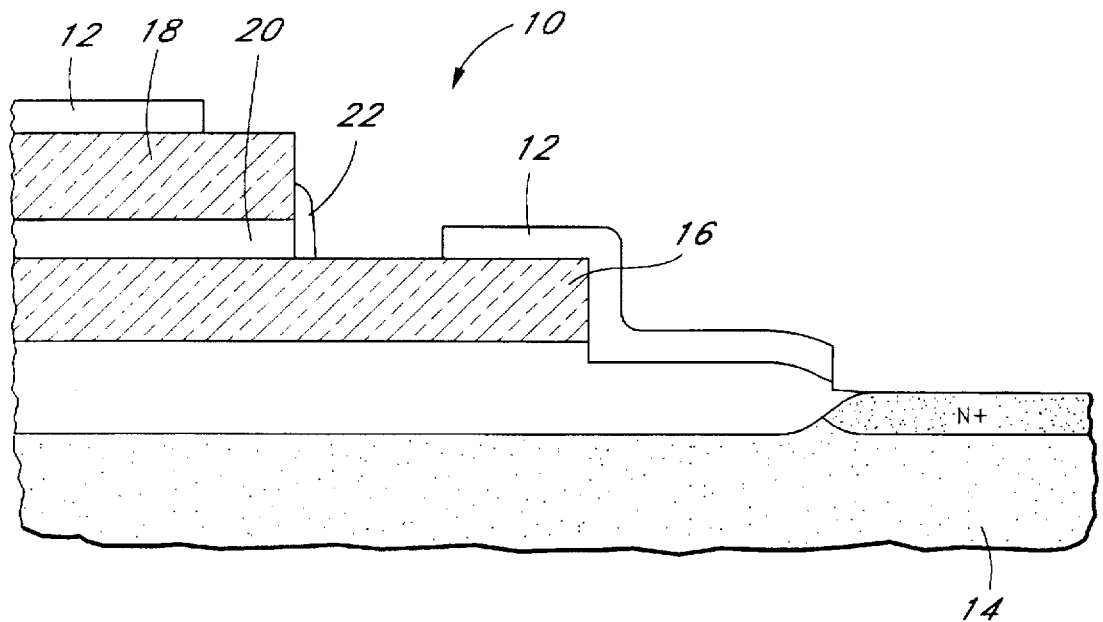
FIG. 1 is a partial schematic sectional view of an integrated circuit, illustrating a butting contact opening over relatively thick polysilicon layers, as provided for in the prior art.
Figure 2:
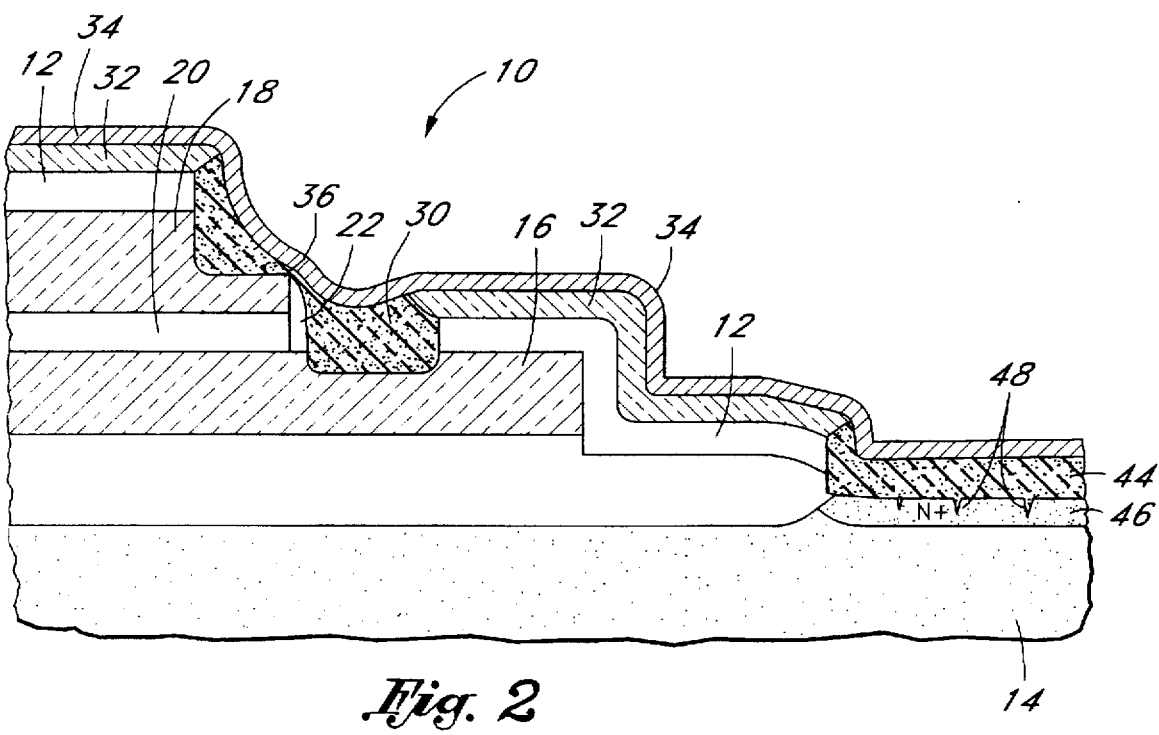
FIG. 2 illustrates a stage in forming silicide straps in the integrated circuit of FIG. 1, making use of prior art salicidation techniques.
Figure 3:
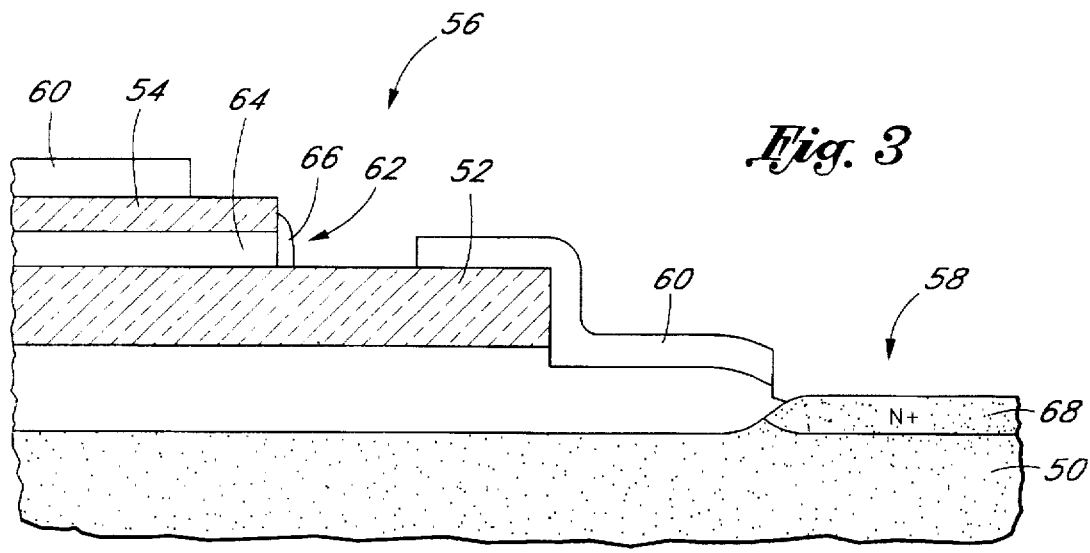
FIGS. 3–6 are partial schematic sectional views of an integrated circuit having a thin polysilicon layer, illustrating generally the method of the present invention.

FIG. 3 illustrates a stage in integrated circuit processing which represents a starting point for an embodiment of the present invention. Overlying a substrate 50, a first polysilicon layer 52 ("poly-1") and a second polysilicon layer 54 ("poly-2") are both at least partially exposed. In the preferred embodiment, the substrate 50 is also exposed through a drain contact 58. The poly-1 52 and poly-2 54 layers in the illustrated embodiment are exposed in step formation, resulting in a butting contact opening 56 or simply butting contact 56. In different embodiments, other layers or circuit nodes may also be present and exposed. Processes used to fabricate the circuit to this point vary and at any rate are known in this art.

The butting contact 56 and the drain contact 58 were etched through a top insulating layer 60 using standard photolithographic processes and etch steps. The insulating material in the preferred embodiment is an oxide 60 in the form of tetraethyl orthosilicate (TEOS), but it may also be a nitride or other passivating material which is relatively non-reactive and impervious to later process steps, such as many dielectrics. If other layers (not shown in this embodiment) are to be strapped, they too would be exposed by the etch step.

The invention is of particular utility where a gap must be spanned between silicon layers in an integrated circuit, and especially where at least one polysilicon layer is too thin to support salicidation. The gap is generally an electrically isolating layer of some sort. In the preferred embodiment, a gap 62 to be spanned is represented by an interlayer oxide 64 and an oxide spacer 66. The oxide spacer 66 naturally results as a byproduct of a previous etch step which opens the butting contact 56.

The thickness of the polysilicon layers may be between 100 Å and 10,000 Å, depending upon the application. Although they need not be thick enough to fully supply silicon to the later silicidation process, they must be thick enough to supplement the process. In the preferred embodiment, the poly-1 layer 52 should be between about 1200 Å and 4000 Å, and most preferably at least about 2500 Å. The poly-2 layer 54 may also be within the same range. However, due to particular utility of practicing the invention in association with thin polysilicon layers, the poly-2 layer 54 of the preferred embodiment is most preferably about 250 Å thick. Thus, the poly-2 layer 54 of the preferred embodiment is too thin to completely support silicidation of a typical metal layer used for self-aligned straps, such as a 500 Å layer of titanium.

The interlayer oxide 64 represents the bulk of gap 62 to be spanned. Thus, holding all other parameters constant, there will be a maximum thickness beyond which the gap 62 cannot be spanned. For the preferred embodiment, the interlayer oxide 64 thickness should be between about 100 Å and 1000 Å, and most preferably about 200 Å.

The contact mask may or may not provide for an opening over the silicon substrate 50. In the preferred embodiment, a device active region 68 is to be clad with silicide so that the drain contact 58 is provided. Thus, the invention advantageously allows formation of silicide cladding while at the same time providing silicide straps across polysilicon layers, without the need for additional masks.

Figure 4:
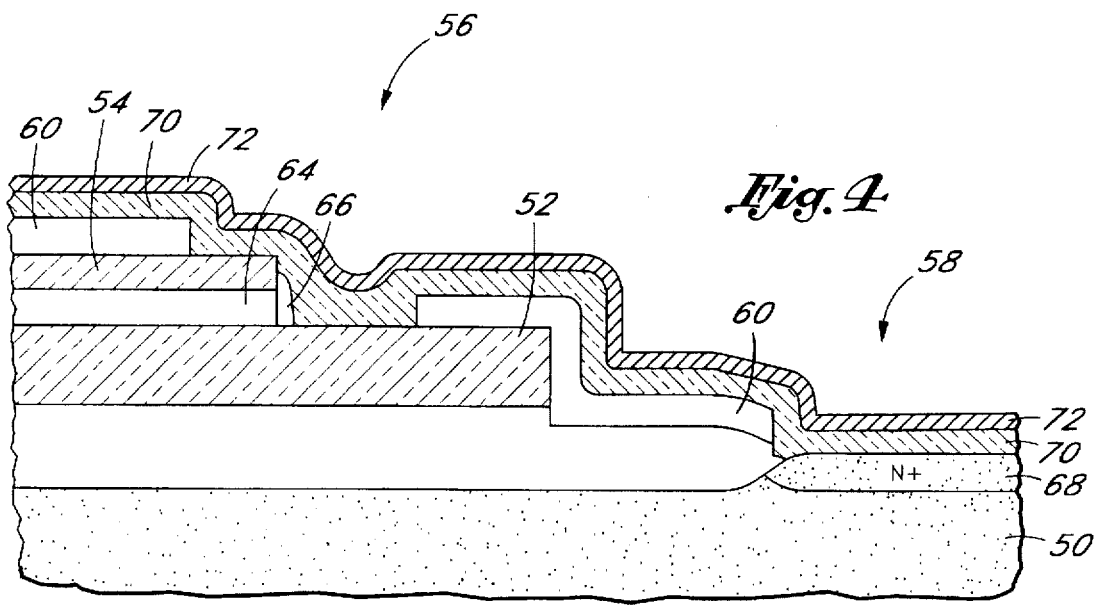

FIG. 4 illustrates the integrated circuit following the next two deposition steps. A silicon source layer 70, preferably in the form of a third polysilicon layer 70 (poly-3), is deposited over the top oxide 60 to contact the poly-2 54 and poly-1 52 layers and the active area 68. A metal layer 72, preferably comprising a refractory metal, is next deposited over the poly-3 layer 70. In the preferred embodiment, elemental titanium (Ti) is deposited. Since the silicidation step to follow is self-aligned, no mask is required for either of these two deposited layers. The poly-3 layer 70 essentially serves as a source of silicon (Si) for the later silicidation step. Accordingly, grown polysilicon, deposited amorphous silicon ($\alpha$-Si), or any other suitable silicon source may be used in place of the deposited poly-3 layer. In addition, the order of deposition may be reversed in alternative embodiments such that the silicon source layer overlies the metal layer.

Although any known method of depositing the poly-3 70 and titanium metal 72 layers may be used, it is important that the layer thicknesses be carefully controlled. Thus, CVD methods, and especially low pressure methods (LPCVD), are preferred for a conformal polysilicon deposition with good step coverage. For the preferred embodiment, the poly-3 layer 70 is deposited with silane ($SiH_4$) as the silicon source, at a temperature of about 620° C. and a pressure of about 200 mTorr. The titanium layer is preferably deposited by sputtering a titanium target, as will be understood by one skilled in the art.

The thickness of the poly-3 layer 70 is chosen such that it cannot support salicidation by itself. The maximum thickness of the poly-3 70 thus depends upon the thicknesses of the titanium layer 72 and the poly-2 layer 54. The titanium layer 72 is preferably between about 200 Å and 1500 Å, and most preferably about 500 Å. For the preferred embodiment, with a titanium deposition of about 500 Å, the poly-3 layer 70 should preferably be between about 100 Å to about 300 Å and more preferably less than 200 Å.

Note, however, that the maximum thickness of the poly-3 layer 70 will be larger if a thicker metal layer 72, and thus thicker silicide, is desired. In the case of titanium metal, the ratio of silicon to titanium (Si:Ti) should be low enough to produce a metal-rich silicide, such as $Ti_5Si_3$ or even $Ti_3Si$, when annealed over unpatterned regions of the top oxide layer 60. For the preferred embodiment, the thickness ratio of Si:Ti (poly-3 layer 70 thickness to titanium layer 72 thickness) should be between about 1:1 and 1:5, more preferably between about 1:2 and 1:4, and most preferably about 1:3. In any case, the thickness of the poly-3 layer 70 over the oxide 60 should be such that it supplies insufficient silicon for complete silicidation of the refractory metal layer 72. "Complete silicidation" will be defined below.

Silicidation is next performed, preferably in an anaerobic environment such as nitrogen gas to prevent contamination of the silicide with oxides. However, for alternate embodiments in which the silicon source layer is laid over the metal layer, greater amounts of atmospheric contaminants are tolerable, as disclosed in Lou et al, "The Process Window of a-Si/Ti Bilayer Metallization for an Oxidation-Resistant and Self-Aligned $TiSi_2$ Process," IEEE Transactions on Electron Devices, Vol. 39, pp. 1835–43 (Aug. 1992). For the preferred embodiment, where titanium overlies silicon, silicidation may be accomplished by sintering or annealing the metal and silicon structure at a temperature between about 600° C. and 900° C., more preferably between about 600° C. and 700° C., most preferably about 650° C. This first anneal may be performed for between 10 seconds and 60 seconds, but most preferably for about 30 seconds.

Figure 5:
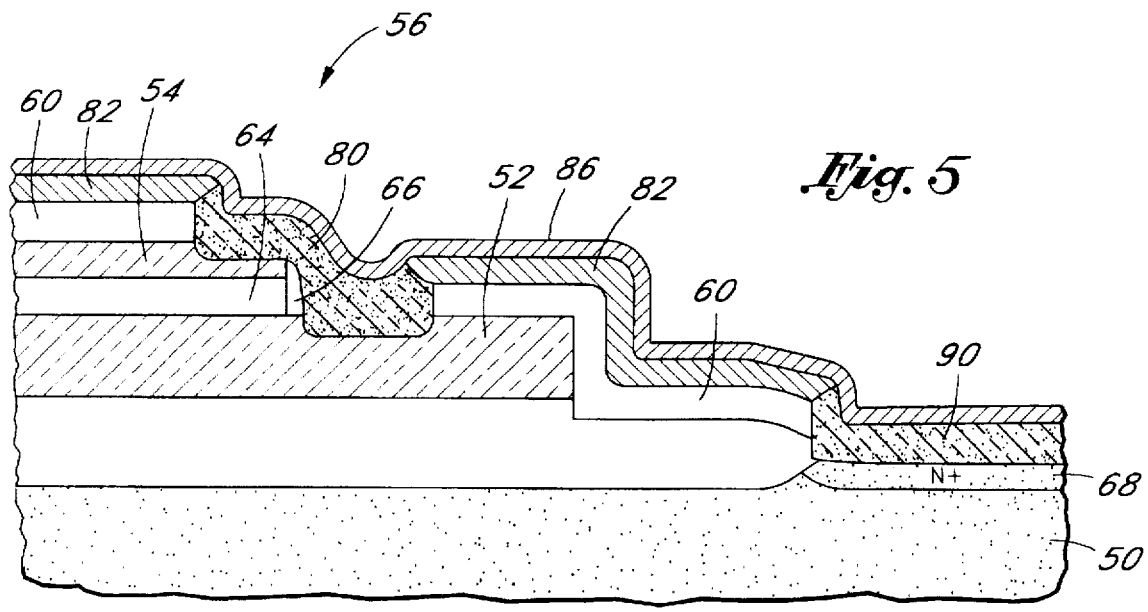

FIG. 5 illustrates the result of the silicidation step. Although, individually, both the poly-2 54 and the poly-3 70 are too thin to support silicidation of all the titanium 72, the combination of the poly-2 54 and poly-3 70 at the butting contact opening 56 over the poly-2 layer 54 does provide enough silicon to support silicidation of the titanium layer 72. Similarly, the combination of the poly-1 52 and poly-3 70 at the butting contact opening 56 over the poly-1 layer 52 also provides enough silicon for complete silicidation. As a result, a stable silicide represented by "$TiSi_x$" is formed in regions within the contact opening 56, where x approaches 2. Thus, a silicide strap 80 is formed, spanning the poly-1 52 and poly-2 54 layers.

In contrast, in regions over the oxide layer 60, the poly-3 70 alone is available for silicidation with the titanium layer 72 (FIG. 4). In these regions, a metal-rich silicide 82 is formed, which may be represented by "$TiSi_y$" 82, where y is less than x. This terminology is simply meant to convey atomic or molar proportions, rather than a stoichiometric compound. The $TiSi_y$ 82 may include a mixture of $Ti_5Si_3$ and $Ti_3Si$.

Due to the lower ratio of silicon to titanium, it is possible to selectively remove the more metallic $TiSi_y$ 82 without attacking much of the silicon-rich $TiSi_x$ which forms the silicide strap 80. The selective removal may be accomplished by a conventional wet metal etch or cleaning step. For example, a 1:10 solution of hydrogen peroxide ($H_2O_2$) and sulfuric acid ($H_2SO_4$), known as HH, may be used in this step. The silicon-rich and stable $TiSi_x$ silicide strap 80, predominantly $TiSi_2$, remains relatively unharmed by the etch.

Since, in the preferred embodiment, the silicidation step is performed in a nitrogen environment, a thin layer of titanium nitride 86 (TiN) is also formed as a byproduct of the reaction. The TiN layer 86 overlies all areas, including both $TiSi_x$ of the strap 80 and the metal-rich $TiSi_y$ 82. This TiN layer 86 may also be removed, along with the $TiSi_y$ 82, in the metal etch step described above.

A second anneal may be performed after the wet etch, in order to lower the resistance of the silicide strap 80. This anneal, which may be performed at about 800° C. for about 20 seconds, converts titanium silicide from the C49 phase to the C54 phase. It will be understood, however, that alternative silicide materials may not require this second anneal step.

The definition of "complete silicidation" is therefore silicidation until the ratio of Si:Ti within the silicide is such that the silicide would be left largely undamaged by cleaning step described above. For the preferred etch chemical concentrations, the silicide strap 80 formed in the butting contact opening 56 comprises $TiSi_x$, where x is preferably greater than about 2.0, and most preferably x is equal to about 2.0. Conversely, the metal-rich silicide 82 formed over the top oxide layer 60 comprises $TiSi_y$, where y is less than about 2.0 and most preferably less than about 1.0.

It will be understood by one of skill in the art that the range of layer thickness ratios approximately corresponds to the resultant values of x and y in $TiSi_x$ and $TiSi_y$, respectively. For different refractory metals, the preferred atomic ratios, or values of x and y, may remain as described for titanium silicide. Thus, if tungsten silicide is to form the silicide strap, $WSi_x$ should form within the butting contact, where x approaches 2, and similarly for $CoSi_2$. The thickness of the deposited tungsten metal layer will differ from that of a corresponding titanium layer, however, since tungsten and titanium have different densities.

Note that, although thickness of the deposited poly-3 layer 70 and the titanium layer 72 are important to optimal performance, the silicide strap 80 of the present invention is less sensitive to metal layer thickness than prior art salicide straps have been. Thus, for a given thickness of poly-2 or poly-1 layers, the present invention allows use of a thicker titanium layer without fear of overconsuming the polysilicon layers below. This situation is said to result in a greater process window for salicidation.

Additionally, the strap process may be combined with the fabrication of a cladding over the active area 68 or of a local interconnect. In the preferred embodiment, some silicon from the substrate 50 aids silicidation through the drain contact opening 58, but less spiking occurs due to the additional silicon provided by the poly-3 70 (see FIG. 4). Thus, the combination of the substrate 50 and poly-3 70 supplies enough silicon to support silicidation over the active area 68. A resultant cladding 90 comprises TiSi$_x$, similar to the silicide strap 80 discussed above. Thus, the silicide cladding 90 also remains undamaged by the wet etch described above. As is known in the art, the silicide cladding 90 forms ohmic contact with the active area 68 and thus requires no mask for doping.

The present invention may also be combined with the formation of an extensive local interconnect. To accomplish this, an additional layer of polysilicon would be deposited though a local interconnect mask over the insulating layer before titanium deposition. In this way, additional silicon is provided for complete silicidation of entire lines from one active area to another, thereby eliminating the second level of metallization. This method is especially economical over short distances, where sheet resistance remains unimportant relative to contact resistance.

Figure 6:
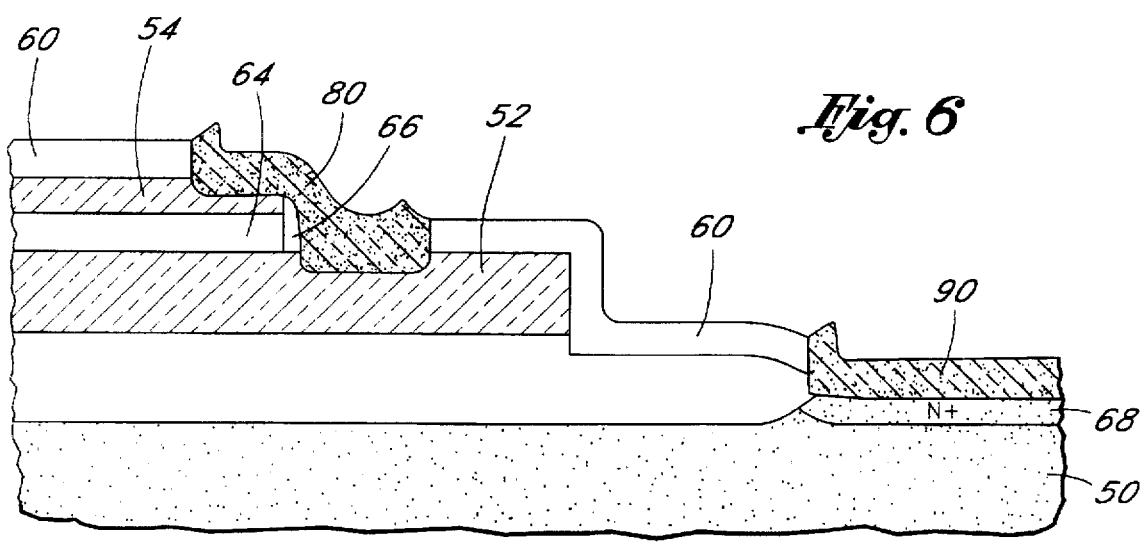

FIG. 6 illustrates the integrated circuit following the selective metal etch or cleaning step. The silicide strap 80, largely comprising TiSi$_2$, provides conduction between the poly-1 52 and the poly-2 54, while the excess metal, including TiN 86 and metal-rich TiSi$_y$ 82 (FIG. 5), has been cleaned away. The preferred embodiment includes a silicide cladding 90, formed over the active region 68 within the substrate 50. The cladding 90 provides low-resistance contact to later-formed conducting layers such as aluminum or to other circuit nodes. Because the silicidation is self-aligned, no additional mask is required.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A method of forming a self-aligned strap across at least two silicon layers in an integrated circuit, said silicon layers separated by an insulating gap, said method comprising the steps of:

forming a contact window through a top insulating layer, exposing a first silicon layer and a second silicon layer;

depositing a metal layer of a pre-determined thickness over the top insulating layer and the exposed first and second silicon layers;

forming a third silicon layer over the top insulating layer and the exposed first and second silicon layers, the third silicon layer supplying insufficient silicon for complete silicidation of pre-determined thickness of the metal layer; and sintering the integrated circuit to form a silicon-rich silicide in a region over the exposed first and second silicon layers, the silicon-rich silicide bridging the insulating gap.

2. The method of claim 1, wherein the metal deposition step is performed after the third silicon layer forming step.

3. The method of claim 2, wherein the metal layer comprises a refractory metal.

4. The method of claim 3, wherein the refractory metal comprises titanium and the ratio of silicon atoms to refractory metal atoms within the silicon-rich silicide is at least 2:1.

5. The method of claim 4, wherein each of the first silicon layer and the second silicon layer comprise sufficient silicon in combination with the third silicon layer form the silicon-rich silicide.

6. The method of claim 3, wherein the sintering step produces a metal-rich silicide over the insulating layer, further comprising the step of cleaning the metal-rich silicide from the circuit.

7. The method of claim 6, wherein the cleaning step comprises etching away the metal-rich silicide with a solution of $H_2O_2$ and $H_2SO_4$.

8. The method of claim 7, wherein a top layer of metal nitride is produced by the sintering step over both the silicon-rich silicide and the metal-rich silicide, and the cleaning step etches away both the metal-rich silicide and the metal nitride.

9. The method of claim 8, wherein the ratio of $H_2O_2$ to $H_2SO_4$ is about 10:1.

10. The method of claim 3, wherein the third silicon layer alone supplies insufficient silicon for formation of the silicon-rich silicide.

11. The method of claim 10, wherein the refractory metal comprises titanium.

12. The method of claim 11, wherein a ratio of silicon atoms in the third silicon layer to metal atoms in the metal layer is less than 2:1.

13. The method of claim 12, wherein the ratio of silicon atoms in the third silicon layer to metal atoms in the metal layer is less than 1:1.

14. The method of claim 13, wherein the third silicon layer has a thickness between about 100 Å and 300 Å and the metal layer has a thickness between about 400 Å and 600 Å.

15. The method of claim 3, wherein the third silicon layer forming step comprises a low pressure chemical vapor deposition.

16. The method of claim 3, wherein the refractory metal layer deposition step comprises a sputter deposition.

17. The method of claim 3, wherein the sintering step comprises heating the integrated circuit to a temperature between 600° C. and 900° C. under atmospheric pressure for a time interval between 10 second and 60 seconds.

18. The method of claim 17, wherein the sintering step comprises heating the integrated circuit to a temperature between 600° C. and 650° C. for a time interval between 20 seconds and 40 seconds.

19. The method of claim 3, wherein the contact window forming step further exposes at least one active area of a substrate, and a silicon-rich silicide cladding forms in contact with the active area.

20. The method of claim 19, wherein the contact window forming step further patterns the top insulating layer for local interconnection and the silicide cladding forms part of a local interconnect layer.

21. A method of forming a self-aligned strap across at least two polysilicon layers in an integrated circuit, said polysilicon layers separated by an interlayer insulator, said method comprising the steps of:

opening a butting contact window through a top insulating layer, exposing a first polysilicon layer, a second polysilicon layer having a butting end, and at least one circuit node;

depositing a third polysilicon layer over the top insulating layer, the exposed first and second polysilicon layers and the exposed circuit node;

depositing a refractory metal layer of a pre-determined thickness over the third polysilicon layer;

sintering the integrated circuit to form a silicon-rich silicide strap contacting the exposed first and second polysilicon layers, a silicon-rich silicide local interconnect contacting the circuit node, and a metal-rich silicide over the top insulating layer; and cleaning the metal-rich silicide from the integrated circuit.

22. The method of claim 21, wherein cleaning the metal-rich silicide comprises selectively etching the metal-rich silicide relative to the silicon-rich silicide.

23. A method of forming a self-aligned strap across at least two silicon layers in an integrated circuit, said silicon layers separated by an interlayer insulator, said method comprising the steps of:

opening a butting contact window through a top insulating layer, exposing a first silicon layer, a second silicon layer over the first silicon layer having a butting end, and at least one circuit node;

depositing a third silicon layer over the top insulating layer, the exposed first and second silicon layers and the exposed circuit node;

depositing a refractory metal layer over the third silicon layer;

heating the integrated circuit to form a silicon-rich silicide strap contacting the exposed first and second silicon layers, a silicon-rich silicide local interconnect contacting the circuit node, and a metal-rich silicide over the top insulating layer; and selectively etching the metal-rich silicide from the integrated circuit.

\* \* \* \* \*